US012701822B2

(12) United States Patent
Niwa et al.

(10) Patent No.: US 12,701,822 B2
(45) Date of Patent: Aug. 4, 2026

(54) METHOD OF MANUFACTURING SEMICONDUCTOR LIGHT-EMITTING ELEMENT

(71) Applicant: NIKKISO CO., LTD., Tokyo (JP)

(72) Inventors: Noritaka Niwa, Ishikawa (JP); Tetsuhiko Inazu, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 387 days.

(21) Appl. No.: 18/340,290

(22) Filed: Jun. 23, 2023

(65) Prior Publication Data

US 2023/0420603 A1 Dec. 28, 2023

(30) Foreign Application Priority Data

Jun. 24, 2022 (JP) ................................. 2022-102004

(51) Int. Cl.
*H10H 20/01* (2025.01)
(52) U.S. Cl.
CPC ............................ *H10H 20/01335* (2025.01)
(58) Field of Classification Search
None
See application file for complete search history.

(56) References Cited

U.S. PATENT DOCUMENTS

| | | | |
|---|---|---|---|
| 2013/0140605 A1* | 6/2013 | Ramdani | H10D 30/015 |
| | | | 257/192 |
| 2019/0280150 A1* | 9/2019 | Igarashi | H01L 21/3065 |
| 2019/0390332 A1* | 12/2019 | Nishimura | C23C 16/345 |
| 2022/0223381 A1* | 7/2022 | Liu | H01J 37/321 |

FOREIGN PATENT DOCUMENTS

| | | |
|---|---|---|
| JP | 2008218826 A | 9/2008 |
| JP | 2018-085456 A | 5/2018 |
| TW | I727116 B | 8/2018 |
| WO | WO-2006080376 A1 | 8/2006 |

* cited by examiner

*Primary Examiner* — Bradley Smith
(74) *Attorney, Agent, or Firm* — MUNCY, GEISSLER, OLDS & LOWE, P.C.

(57) ABSTRACT

A method of manufacturing a semiconductor light-emitting element includes: forming an active layer of an AlGaN-based semiconductor material on an n-type semiconductor layer of an n-type AlGaN-based semiconductor material; forming a p-type semiconductor layer on the active layer; removing a portion of the p-type semiconductor layer and the active layer by dry etching to expose an upper surface of the n-type semiconductor layer; treating the upper surface of the n-type semiconductor layer with a plasma in an atmosphere including an $N_2$ gas and an $NH_3$ gas; and forming a n-side contact electrode on the upper surface of the n-type semiconductor layer treated with the plasma.

2 Claims, 2 Drawing Sheets

METHOD OF MANUFACTURING SEMICONDUCTOR LIGHT-EMITTING ELEMENT

RELATED APPLICATION

Priority is claimed to Japanese Patent Application No. 2022-102004, filed on Jun. 24, 2022, the entire content of which is incorporated herein by reference.

BACKGROUND OF THE INVENTION

1. Field of the Invention

The present invention relates to a method of manufacturing semiconductor light-emitting elements.

2. Description of the Related Art

A semiconductor light-emitting element includes an n-type semiconductor layer, an active layer, and a p-type semiconductor layer stacked on a substrate. The upper surface of the n-type semiconductor layer is exposed by removing a portion of the active layer and the p-type semiconductor layer by dry etching, and an n-side electrode is formed on the exposed upper surface. The upper surface of the n-type semiconductor layer is damaged by dry etching. In order to fix the damage on the upper surface of the n-type semiconductor layer, nitrogen atoms produced by heating and decomposing $NH_3$ are supplied to the exposed upper surface (see, for example, JP2018-85456).

In order to improve the performance of the semiconductor light-emitting element further, it is preferred to improve the contact resistance between the upper surface of the n-type semiconductor layer and the n-side electrode further.

SUMMARY

The present invention addresses the issue described above, and a purpose thereof is to provide a technology of improving the performance of a semiconductor light-emitting element.

A method of manufacturing a semiconductor light-emitting element according to a mode of the present invention includes: forming an active layer of an AlGaN-based semiconductor material on an n-type semiconductor layer of an n-type AlGaN-based semiconductor material; forming a p-type semiconductor layer on the active layer; removing a portion of the p-type semiconductor layer and the active layer by dry etching to expose an upper surface of the n-type semiconductor layer; treating the upper surface of the n-type semiconductor layer with a plasma in an atmosphere including an $N_2$ gas and an $NH_3$ gas; and forming a n-side contact electrode on the upper surface of the n-type semiconductor layer treated with the plasma.

DETAILED DESCRIPTION OF THE INVENTION

Figure 1:
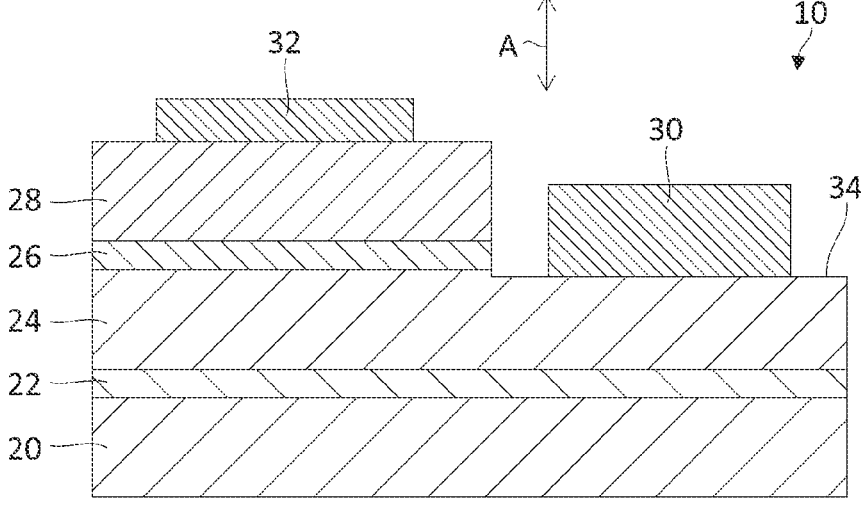
FIG. 1 is a cross-sectional view schematically showing a configuration of a semiconductor light-emitting element according to the embodiment.

The invention will now be described by reference to the preferred embodiments. This does not intend to limit the scope of the present invention, but to exemplify the invention.

A description will be given of an embodiment of the present invention with reference to the drawings. The same numerals are used in the description to denote the same elements, and a duplicate description is omitted as appropriate. To facilitate the understanding, the relative dimensions of the constituting elements in the drawings do not necessarily mirror the actual relative dimensions in the light-emitting element.

The semiconductor light-emitting device according to the embodiment is configured to emit ultraviolet light having a central wavelength approximately equal to or less than 360 nm. To output ultraviolet light having such a wavelength, an aluminum gallium nitride (AlGaN)-based semiconductor material having a band gap approximately equal to or more than 3.4 eV is used. In the embodiment, a deep ultraviolet-light emitting diode (DUV-LED) chip configured to emit deep ultraviolet light having a central wavelength A of about 240 nm-320 nm will be highlighted.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN. The "AlGaN-based semiconductor material" in this specification has a molar fraction of AlN and a molar fraction of GaN equal to or more than 1%, and, preferably, equal to or more than 5%, equal to or more than 10%, or equal to or more than 20%.

Those materials that do not contain AlN may be distinguished by referring to them as "GaN-based semiconductor materials". "GaN-based semiconductor materials" encompass GaN and InGaN. Similarly, those materials that do not contain GaN may be distinguished by referring to them as "AlN-based semiconductor materials". "AlN-based semiconductor materials" encompass AlN and InAlN.

FIG. 1 is a cross-sectional view schematically showing a configuration of a semiconductor light-emitting element 10 according to the embodiment. The semiconductor light-emitting element 10 includes a substrate 20, a base layer 22, an n-type semiconductor layer 24, an active layer 26, a p-type semiconductor layer 28, an n-side contact electrode 30, and a p-side contact electrode 32.

Referring to FIG. 1, the direction indicated by the arrow A may be referred to as "vertical direction" or "direction of thickness". Further, the direction away from the substrate 20 may be defined as "upward", and the direction toward the substrate 20 may be defined as "downward".

The substrate 20 is made of a material having translucency for the ultraviolet light emitted by the semiconductor light-emitting element 10. The substrate 20 is made of, for example, sapphire ($Al_2O_3$). The substrate 20 may be made of AlN or made of AlGaN.

The base layer 22 is provided on the substrate 20. The base layer 22 is a foundation layer (template layer) to form the n-type semiconductor layer 24. For example, the base layer 22 is an undoped AlN layer and is, specifically, an AlN layer gown at a high temperature (HT-AlN; High Temperature AlN). The base layer 22 may further include an undoped AlGaN layer formed on the AlN layer. The base layer 22 may be comprised only of an undoped AlGaN layer when the substrate 20 is an AlN substrate or an AlGaN substrate. In other words, the base layer 22 includes at least one of an undoped AlN layer or an undoped AlGaN layer.

The n-type semiconductor layer 24 is provided on the base layer 22. The n-type semiconductor layer 24 is made of an n-type AlGaN-based semiconductor material. For example, the n-type semiconductor layer 24 is doped with Si as an n-type impurity. The AlN molar fraction of the n-type semiconductor layer 24 is equal to or more than 25% and, preferably, equal to or more than 40% or equal to or more than 50%. The AlN molar fraction of the n-type semiconductor layer 24 is equal to or less than 80% and, preferably, equal to or less than 70%. The n-type semiconductor layer 24 has a thickness equal to or more than 1 μm and equal to or less than 3 μm. For example, the n-type semiconductor layer 24 has a thickness of about 2 μm.

The active layer 26 is provided on the n-type semiconductor layer 24. The active layer 26 is made of an AlGaN-based semiconductor material and has a double heterojunction structure by being sandwiched between the n-type semiconductor layer 24 and the p-type semiconductor layer 28. To output ultraviolet light having a wavelength equal to or less than 355 nm, the active layer 26 is formed to have a band gap equal to or more than 3.4 eV. For example, the AlN composition ratio of the active layer 26 is selected so as to output deep ultraviolet light having a wavelength equal to or less than 320 nm.

For example, the active layer 26 has a monolayer or multilayer quantum well structure and is comprised of a barrier layer made of an undoped AlGaN-based semiconductor material and a well layer made of an undoped AlGaN-based semiconductor material. The active layer 26 includes, for example, a first barrier layer in contact with the n-type semiconductor layer 24 and a first well layer provided on the first barrier layer. One or more pairs of the barrier layer and the well layer may be additionally provided between the first well layer and the p-type semiconductor layer 28. Each of the barrier layer and the well layer has a thickness equal to or more than 1 nm and equal to or less than 20 nm, and has, for example, a thickness equal to or more than 2 nm and equal to or less than 10 nm.

An electron block layer may further be provided between the active layer 26 and the p-type semiconductor layer 28. The electron block layer is made of an undoped AlGaN-based semiconductor material. The AlN molar fraction of the electron block layer is equal to or more than 40% and, preferably, equal to or more than 50% or equal to or more than 80%. The electron block layer may be made of AlN that does not contain GaN.

The p-type semiconductor layer 28 is formed on the active layer 26. The p-type semiconductor layer 28 is a p-type AlGaN-based semiconductor material layer or a p-type GaN-based semiconductor material layer. For example, the p-type semiconductor layer 28 is an AlGaN layer or a GaN layer doped with magnesium (Mg) as a p-type impurity. The p-type semiconductor layer 28 has, for example, a thickness equal to or more than 20 nm and equal to or less than 2000 nm.

The n-side contact electrode 30 is provided on an upper surface 34 of the n-type semiconductor layer 24. For example, the n-side contact electrode 30 has a Ti/Al/Ti/Au stack structure. The n-side contact electrode 30 may have a Ti/Al/Ti/TiN stack structure.

The p-side contact electrode 32 is provided on the p-type semiconductor layer 28. The p-side contact electrode 32 has, for example, an Ni/Au stack structure of an Rh layer and an Al layer. The p-side contact electrode 32 may be made of a conductive oxide material such as indium tin oxide (ITO). The p-side contact electrode 32 may include an Rh layer having a high reflectivity for deep ultraviolet light. The p-side contact electrode 32 may be, for example, comprised only of the Rh layer or may have an Rh/Ti/Rh/TiN stack structure.

Figure 2:
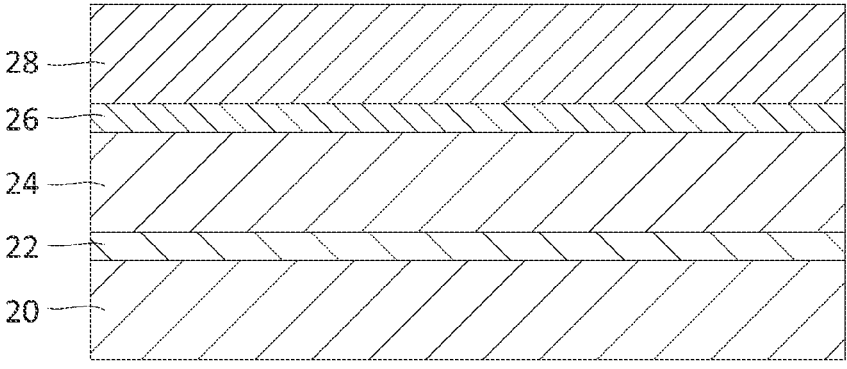
FIG. 2 schematically shows a step of manufacturing the semiconductor light-emitting element.
Figure 3:
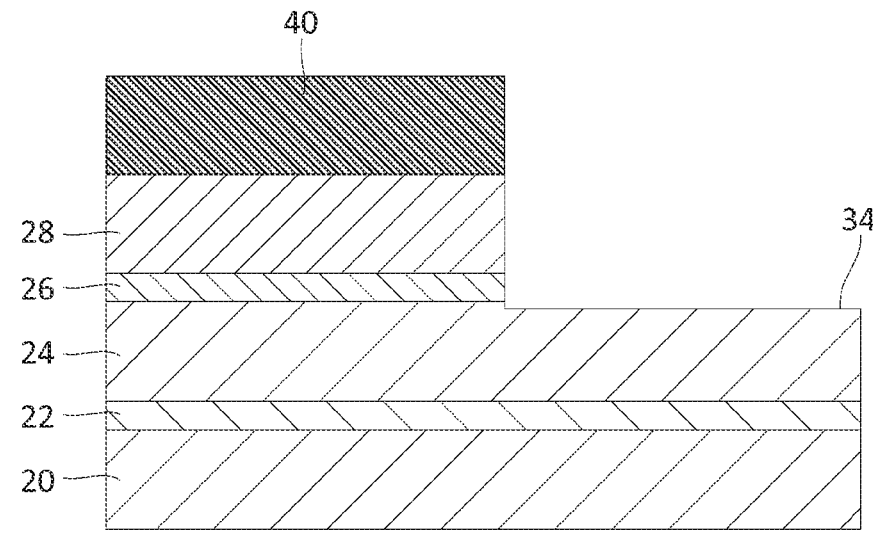
FIG. 3 schematically shows a step of manufacturing the semiconductor light-emitting element.

A description will now be given of a method of manufacturing the semiconductor light-emitting element 10. FIGS. 2-3 schematically show steps of manufacturing the semiconductor light-emitting element 10.

First, referring to FIG. 2, the base layer 22, the n-type semiconductor layer 24, the active layer 26, and the p-type semiconductor layer 28 are formed on the substrate 20 sequentially. The base layer 22, the n-type semiconductor layer 24, the active layer 26, and the p-type semiconductor layer 28 can be formed by a well-known epitaxial growth method such as the metal organic vapor phase epitaxy (MOVPE) method and the molecular beam epitaxy (MBE) method.

Subsequently, as shown in FIG. 3, a mask 40 is formed on the p-type semiconductor layer 28 by using, for example, a publicly known lithographic technology. The p-type semiconductor layer 28 and the active layer 26 in a region not overlapping the mask 40 are then removed by dry-etching or the like to expose the upper surface 34 of the n-type semiconductor layer 24.

An upper surface 34 of the n-type semiconductor layer 24 exposed by dry etching is then treated with a plasma. The plasma treatment is performed in an atmosphere including an $N_2$ gas and an $NH_3$ gas. The plasma treatment causes a nitrogen plasma to affect the upper surface 34 of the n-type semiconductor layer 24 and to fix a damage to the upper surface 34 caused by dry etching.

The plasma treatment time is less than 2 minutes and is preferably equal to or more than 10 seconds and equal to or less than 90 seconds. When the plasma treatment time is equal to or more than 2 minutes, the nitrogen plasma will be excessively supplied to the upper surface 34 of the n-type semiconductor layer 24, resulting in degradation of the contact resistance of the n-side contact electrode 30 on the upper surface 34 of the n-type semiconductor layer 24. It is preferred to configure the plasma output to be equal to or more than 100 W.

It is preferred that the volume ratio of the $NH_3$ gas in the atmosphere of the plasma treatment is equal to or more than 4.6% and equal to or more than 18.8%. By configuring the volume ratio of the $NH_3$ gas in the atmosphere to be equal to or more than 4.6% and equal to or more than 18.8%, the contact resistance of the n-side contact electrode 30 is further improved as compared with a case where the $NH_3$ gas is not included in the atmosphere. When the $NH_3$ gas is excessively included in the atmosphere, the nitrogen plasma is excessively supplied to the upper surface 34 of the n-type semiconductor layer 24, resulting in degradation of the contact resistance.

It is preferred that substantially only the $N_2$ gas and the $NH_3$ gas are included in the atmosphere of the plasma treatment. It is preferred that oxygen, carbon, halogen (F, Cl, etc.), or inert gas (He, Ar, etc.) is not substantially included in the atmosphere of the plasma treatment.

Subsequently, the n-side contact electrode 30 is formed on the upper surface 34 of the n-type semiconductor layer 24 by using, for example, a publicly known lithographic technology. The n-side contact electrode 30 can be formed by deposition or sputtering. After the n-side contact electrode 30 is formed, the n-side contact electrode 30 is annealed. The n-side contact electrode 30 is annealed by using, for example, the RTA method at a temperature equal to or more than 500° C. and equal to or less than 650° C. The annealing process of the n-side contact electrode 30 lowers the contact resistance of the n-side contact electrode 30.

The p-side contact electrode 32 is then formed on the p-type semiconductor layer 28. The p-side contact electrode 32 can be formed by deposition or sputtering. After the p-side contact electrode 32 is formed, the p-side contact electrode 32 is annealed. The p-side contact electrode 32 is annealed by using, for example, the RTA method at a temperature equal to or more than 400° C. and equal to or less than 600° C. The annealing process of the p-side contact electrode 32 lowers the contact resistance of the p-side contact electrode 32.

The semiconductor light-emitting element 10 of FIG. 1 is completed through the steps described above.

Figure 4:
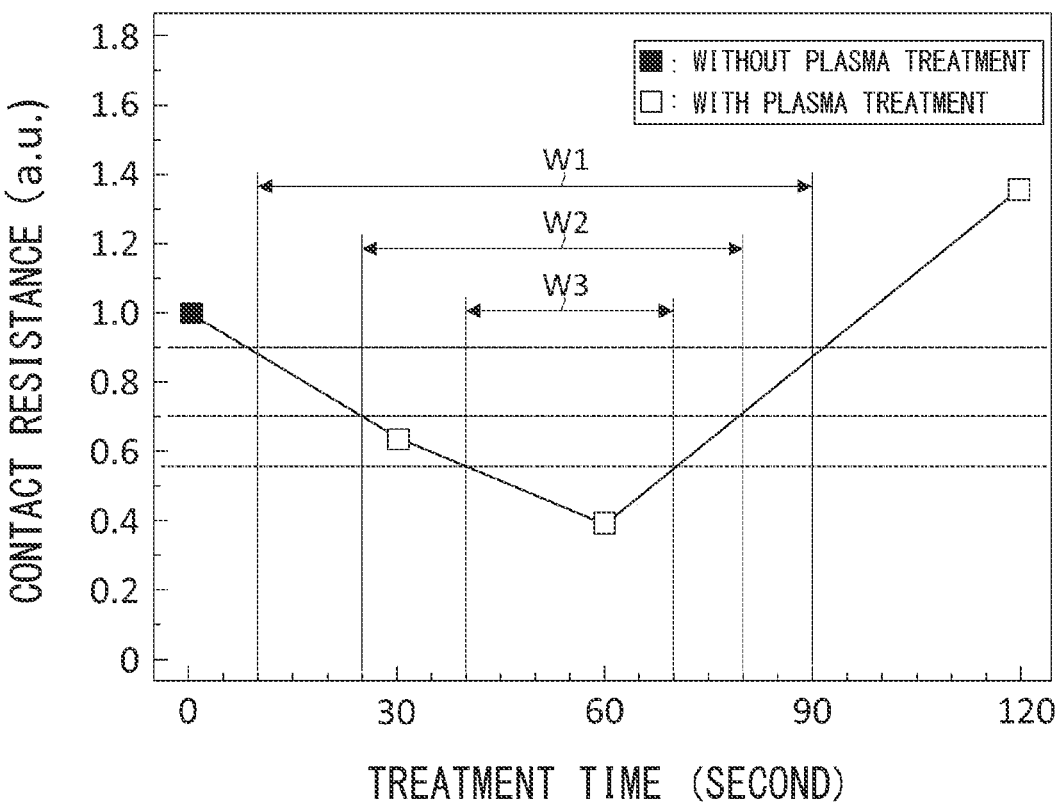
FIG. 4 is a graph showing a relationship between the plasma treatment time and the contact resistance.

The plasma treatment of the upper surface 34 of the n-type semiconductor layer 24 will now be described further. FIG. 4 is a graph showing a relationship between the plasma treatment time and the contact resistance. FIG. 4 shows a case in which the atmosphere pressure in the chamber for plasma treatment is 75 Pa, the $N_2$ gas flow rate is 165 sccm, the $NH_3$ gas flow is 8 sccm, and the plasma output is 90 W. The volume ratio of the $NH_3$ gas in the atmosphere in the chamber is 4.6%.

Referring to FIG. 4, variation in the contact resistance with respect to the plasma treatment time was examined by defining the contact resistance of the n-side contact electrode 30 in the absence of a plasma treatment to be 1. As illustrated, the contact resistance was minimized when the treatment time is 60 seconds. Meanwhile, when the treatment time is equal to or more than 2 minutes, the contact resistance was degraded as compared with a case in which a plasma treatment was not performed.

FIG. 4 demonstrates that the contact resistance can be improved to be equal to or less than 0.9 in a range W1 in which the treatment time is equal to or more than 10 seconds and equal to or less than 90 seconds. Further, the contact resistance can be improved to be equal to or less than 0.7 in a range W2 in which the treatment time is equal to or more than 25 seconds and equal to or less than 80 seconds. Still further, the contact resistance can be improved to be equal to or less than 0.55 in a range W3 in which the treatment time is equal to or more than 40 seconds and equal to or less than 70 seconds.

Figure 5:
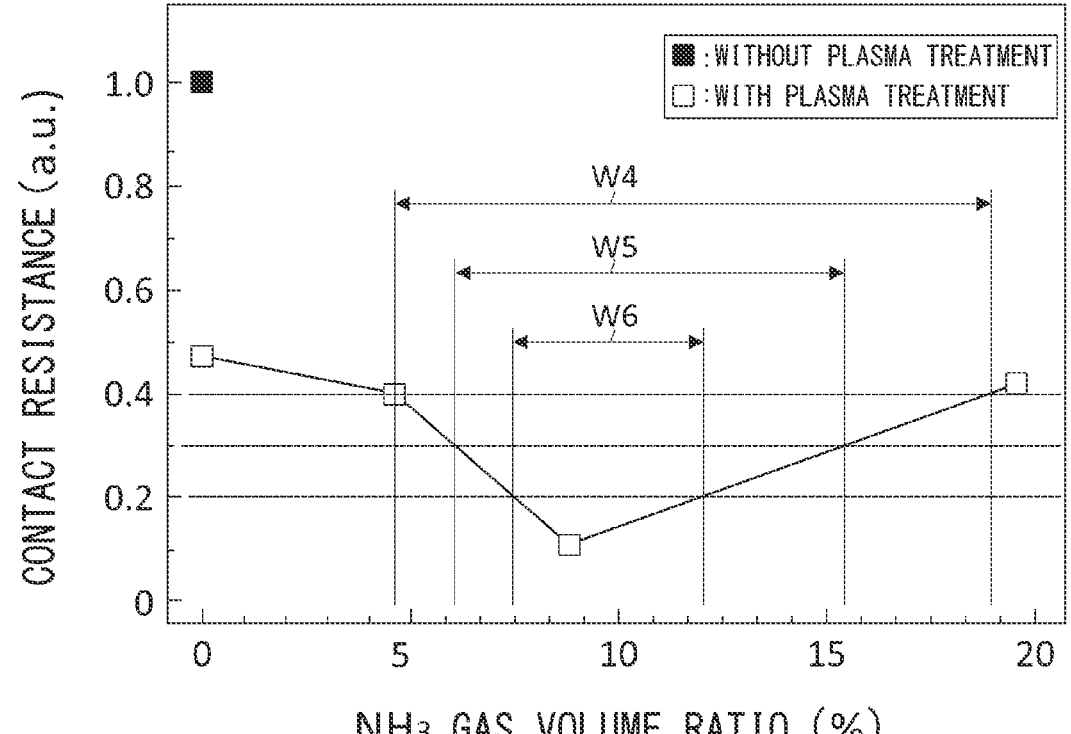
FIG. 5 is a graph showing a relationship between the $NH_3$ gas volume ratio in the atmosphere of the plasma treatment and the contact resistance.

FIG. 5 is a graph showing a relationship between the $NH_3$ gas volume ratio in the atmosphere of the plasma treatment and the contact resistance. FIG. 5 shows a case in which the plasma treatment time is 60 seconds, the atmosphere pressure in the chamber is 75 Pa, the $N_2$ gas flow rate is 165 sccm, and the plasma output is 90 W. The volume ratio of the $NH_3$ gas in the atmosphere in the chamber was changed by setting the $NH_3$ gas flow rate to be 0 sccm, 8 sccm, 16 sccm, and 40 sccm.

In the case of FIG. 5, too, the contact resistance of the n-side contact electrode 30 in the absence of a plasma treatment was defined to be 1. As illustrated, the contact resistance was minimized when the $NH_3$ gas volume ratio was 8.8%. By adjusting the volume ratio of the $NH_3$ gas, the contact resistance was improved as compared with a case in which an $NH_3$ gas is not included, i.e., in a case in which only an $N_2$ is used.

FIG. 5 demonstrates that the contact resistance can be improved to be equal to or less than 0.4 in a range W4 in which the $NH_3$ gas volume ratio is equal to or more than 4.6% and equal to or less than 18.8%. It is further demonstrated that the contact resistance can be improved to be equal to or less than 0.3 in a range W5 in which the $NH_3$ gas volume ratio is equal to or more than 6.1% and equal to or less than 15.3%. It is still further demonstrated that the contact resistance can be improved to be equal to or less than 0.2 in a range W6 in which the $NH_3$ gas volume ratio is equal to or more than 7.6% and equal to or less than 11.8%.

According to the embodiment, the contact resistance of the n-side contact electrode 30 can be improved in a relatively short treatment time by treating the upper surface 34 of the n-type semiconductor layer 24 with a plasma in an atmosphere including an $N_2$ gas and an $NH_3$ gas. This improves the contact resistance of the n-side contact electrode 30 while at the same time inhibiting the impact on the productivity of the semiconductor light-emitting element 10.

According to the embodiment, the contact resistance of the n-side contact electrode 30 can be further improved by configuring the plasma treatment time to be equal to or more than 10 seconds and equal to or less than 90 seconds. Further, the contact resistance of the n-side contact electrode 30 can be further improved by configuring the volume ratio of the $NH_3$ gas in the atmosphere of the plasma treatment to be equal to or more than 4.6% and equal to or more than 18.8%.

Described above is an explanation based on exemplary embodiments. The embodiments are intended to be illustrative only and it will be understood by those skilled in the art that various design changes are possible and various modifications are possible and that such modifications are also within the scope of the present invention.

Some modes of the present invention will be described.

The first mode of the present invention is a method of manufacturing a semiconductor light-emitting element including: forming an active layer of an AlGaN-based semiconductor material on an n-type semiconductor layer of an n-type AlGaN-based semiconductor material; forming a p-type semiconductor layer on the active layer; removing a portion of the p-type semiconductor layer and the active layer by dry etching to expose an upper surface of the n-type semiconductor layer; treating the upper surface of the n-type semiconductor layer with a plasma in an atmosphere including an $N_2$ gas and an $NH_3$ gas; and forming a n-side contact electrode on the upper surface of the n-type semiconductor layer treated with the plasma. According to the first mode, the contact resistance of the n-side contact electrode can be improved in a relatively short treatment time by performing a plasma treatment in an atmosphere including an $N_2$ gas and an $NH_3$ gas.

The second mode of the present invention is the method of manufacturing the semiconductor light-emitting element according to the first mode, wherein a treatment time in the treating with a plasma is equal to or more than 10 seconds and equal to or less than 90 seconds. According to the second mode, the contact resistance of the n-side contact electrode can be further improved by configuring the plasma treatment time to be equal to or more than 10 seconds and equal to or less than 90 seconds.

The third mode of the present invention is the method of manufacturing the semiconductor light-emitting element according to the first or second mode, wherein a volume ratio of the $NH_3$ gas in the atmosphere in the treating with a plasma is equal to or more than 4.6% and equal to or less than 18.8%. According to the third mode, the contact resistance of the n-side contact electrode can be further improved by configuring the volume ratio of the $NH_3$ gas in the atmosphere of the plasma treatment to be equal to or more than 4.6% and equal to or more than 18.8%.

What is claimed is:

1. A method of manufacturing a semiconductor light-emitting element, comprising:

forming an active layer of an AlGaN-based semiconductor material on an n-type semiconductor layer of an n-type AlGaN-based semiconductor material;

forming a p-type semiconductor layer on the active layer;

removing a portion of the p-type semiconductor layer and the active layer by dry etching to expose an upper surface of the n-type semiconductor layer;

treating the upper surface of the n-type semiconductor layer with a plasma in an atmosphere including an $N_2$ gas and an $NH_3$ gas; and forming an n-side contact electrode on the upper surface of the n-type semiconductor layer treated with the plasma, wherein substantially only the $N_2$ gas and the $NH_3$ gas are included in the atmosphere of the plasma treating, and wherein a volume ratio of the $NH_3$ gas in the atmosphere in the treating with a plasma is equal to or more than 4.6% and equal to or less than 18.8%.

2. The method of manufacturing a semiconductor light-emitting element according to claim 1, wherein a treatment time in the treating with a plasma is equal to or more than 10 seconds and equal to or less than 90 seconds.

* * * * *